(12) United States Patent
Hayashi

(10) Patent No.: US 8,208,107 B2
(45) Date of Patent: Jun. 26, 2012

(54) TRANSFLECTIVE TYPE LIQUID CRYSTAL DISPLAY DEVICE

(75) Inventor: Masami Hayashi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/232,202

(22) Filed: Sep. 14, 2011

(65) Prior Publication Data
US 2012/0001188 A1  Jan. 5, 2012

Related U.S. Application Data

(62) Division of application No. 12/277,798, filed on Nov. 25, 2008, now Pat. No. 8,040,487.

(30) Foreign Application Priority Data

Dec. 3, 2007  (JP) ................................. 2007-312224

(51) Int. Cl.
G02F 1/1333 (2006.01)
G02F 1/1335 (2006.01)

(52) U.S. Cl. ........... 349/138; 349/114; 349/153; 349/43

(58) Field of Classification Search .................. 349/114, 349/153, 138, 43; 438/30; 257/E21.002
See application file for complete search history.

(56) References Cited

U.S. PATENT DOCUMENTS 7,737,445 B2    6/2010  Kim et al.
2003/0103181 A1  6/2003  Imayama et al.
2008/0049176 A1  2/2008  Kim et al.
2009/0273749 A1  11/2009 Miyamoto et al.

FOREIGN PATENT DOCUMENTS

JP  2003-167258  6/2003

Primary Examiner — Thoi Duong
(74) Attorney, Agent, or Firm — Oblon, Spivak, McClelland, Maier & Neustadt, L.L.P.

(57) ABSTRACT

A transflective type liquid crystal display device that includes a first substrate including a thin film transistor formed thereover, a second substrate arranged oppositely to the first substrate, a sealing material, formed in a shape of a frame surrounding a display area, to bond the first substrate and the second substrate, an inorganic insulating film to cover the thin film transistor over the first substrate, an organic film formed on the inorganic insulating film, and a pixel electrode including a transmissive electrode provided on the organic film and a reflective electrode provided on a part of the transmissive electrode, and the pixel electrode connecting to the thin film transistor through a contact hole penetrating the organic film and the inorganic insulating film.

3 Claims, 13 Drawing Sheets

TRANSFLECTIVE TYPE LIQUID CRYSTAL DISPLAY DEVICE

CROSS-REFERENCE TO RELATED APPLICATIONS

This application is a divisional application of U.S. application Ser. No. 12/277,798, filed Nov. 25, 2008, and claims priority to Japanese Patent Application No. 2007-312224, filed Dec. 3, 2007, the contents of each of which are incorporated herein by reference.

BACKGROUND OF THE INVENTION

1. Field of the Invention

The present invention relates to a transflective type liquid crystal display device and a manufacturing method thereof.

2. Description of Related Art

In general, a liquid crystal display device is classified into two types, i.e., a transmissive type and a reflective type. The transmissive type liquid crystal display device displays an image by using a backlight placed on the back surface side. The reflective type liquid crystal display device displays an image by using a reflective plate placed on the substrate and reflecting ambient light on the surface of the reflective plate. The transmissive liquid crystal display device has a disadvantage that when ambient light is very bright, such as direct sunlight, it is difficult to view the display since display light is darker than the ambient light. On the other hand, the reflective liquid crystal display device has a disadvantage that visibility decreases significantly when ambient light is dark.

In order to compensate these disadvantages, there is proposed a transflective type liquid crystal display device which has both a transmission mode of transmitting a part of light and a reflection mode of reflecting a part of light. In the transflective type liquid crystal display device, an organic film which has uneven (concave or convex) patterns on its surface is coated over an insulating film so as to obtain good scattering characteristics. For example, after coating an organic film over on an insulating film by spin coating, depressed portions are patterned on the surface of the organic film by a photolithography process so as to form there uneven patterns.

This organic film is patterned into a predetermined shape within the display area, while the organic film outside the display area is conventionally formed without patterning over the surface. That is, the organic film is formed from the display area to the frame area which is outside of the sealing portion. Therefore, the organic film contacts the air at the outside of the sealing portion, and absorbs moisture as the time passes. Then, the moisture permeates into the panel through the organic film. This causes disorder of orientation of liquid crystal molecules when the liquid crystal display device is used for a long period of time, so that defective display easily occurs, thereby decreasing reliability.

As a method for solving such a problem, it is effective not to apply the organic film under the sealing portion. For example, in Japanese Unexamined Patent Application No. 2003-167258, there is disclosed a liquid crystal display device of a structure having no organic film under the sealing portion. In the Japanese Unexamined Patent Application No. 2003-167258, an opening is formed in the forming area of a sealing material. The opening penetrates an inorganic insulating film covering a thin film transistor (TFT) and an organic film layered over the inorganic insulating film, and reaches an interlayer insulating film applied between a source line and a gate line. Then, the sealing material is formed in this opening in order to bond opposing substrates. Since this structure makes the sealing material adhere not to the organic film but to the interlayer insulating film, thereby increasing the adhesion strength.

Moreover, according to the Japanese Unexamined Patent Application No. 2003-167258, at the display area side from the sealing portion, the connection of the source line is changed to a line formed of the same layer as that of the gate line, and then the source line is led to the outside of the sealing portion. Thus, since the source line is once changed to the same layer as that of the gate line, the upper part of a lead line underlying the sealing portion is protected by the interlayer insulating film. By virtue of this structure, it is possible to prevent the lead line of the source line from directly contacting the sealing material, thereby maintaining good resistance to corrosion.

However, the structure described in the Japanese Unexamined Patent Application No. 2003-167258 needs to be provided with a change unit for changing the source line to the lead line of the same layer as that of the gate line. Therefore, in the change unit, a contact hole is formed in the interlayer insulating film in order to connect the source line to the lead line in the same layer as that of the gate line. Thus, the step of forming the contact hole in the interlayer insulating film is newly needed, thereby increasing the number of manufacturing steps. Moreover, space for the change unit is also newly needed, thereby increasing the width of the frame area.

Moreover, according to the Japanese Unexamined Patent Application No. 2003-167258, at the process of forming the contact hole for connecting a drain electrode to a pixel electrode, an opening which penetrates the inorganic insulating film and the organic film is formed in the sealing portion. Specifically, after forming an inorganic insulating film which covers the TFT, a pattern of an organic film is formed thereon. Dry etching of the inorganic insulating film is performed using this pattern of the organic film as a mask. At this time, the interlayer insulating film under the inorganic insulating film is exposed to an etching gas at the opening. Thus, the interlayer insulating film may be damaged, thereby there is concern that insulation between the lead lines may be decreased. If the interlayer insulating film is further damaged, the lead line will be exposed to contact the sealing material directly, so that there is a possibility of the line being broken by corrosion. Thus, there is concern that the reliability may be reduced.

In addition, another method can be considered in which when forming the opening which penetrates the inorganic insulating film and the organic film in the sealing portion, patterning of the inorganic insulating film is performed first, and then, a pattern of the organic film is formed thereon in order to reduce the damage of the interlayer insulating film. However, according to this method, the inorganic insulating film is patterned separately, thereby increasing the number of the steps of photolithography by adding one step. Thus, there is a problem of causing an increase of the manufacturing cost and a lengthening of the manufacturing period.

The present invention has been contrived to solve the problem described above, and an object thereof is to provide a transflective type liquid crystal display device which can improve the reliability without increasing the number of photolithography steps, and to provide a manufacturing method thereof.

SUMMARY OF THE INVENTION

In accordance with one example of the present invention, there is provided a transflective type liquid crystal display device that includes a first substrate including a thin film transistor formed thereover, a second substrate arranged oppositely to the first substrate, a sealing material, formed in a shape of a frame surrounding a display area, to bond the first substrate and the second substrate, an inorganic insulating film to cover the thin film transistor over the first substrate, an organic film formed on the inorganic insulating film, and a pixel electrode including a transmissive electrode provided on the organic film and a reflective electrode provided on a part of the transmissive electrode, and the pixel electrode connecting to the thin film transistor through a contact hole penetrating the organic film and the inorganic insulating film. The organic film includes a thick film portion provided under the reflective electrode, a thin film portion formed outside of the transmissive electrode and having a film thickness thinner than a film thickness of the thick film portion, and an opening. The sealing material is arranged in the opening.

The present invention is able to provide a transflective type liquid crystal display device which can improve the reliability without increasing the number of photolithography steps, and to provide a manufacturing method thereof.

The above and other objects, features and advantages of the present invention will become more fully understood from the detailed description given hereinbelow and the accompanying drawings which are given by way of illustration only, and thus are not to be considered as limiting the present invention.

DESCRIPTION OF THE EXEMPLARY EMBODIMENTS

Figure 1:
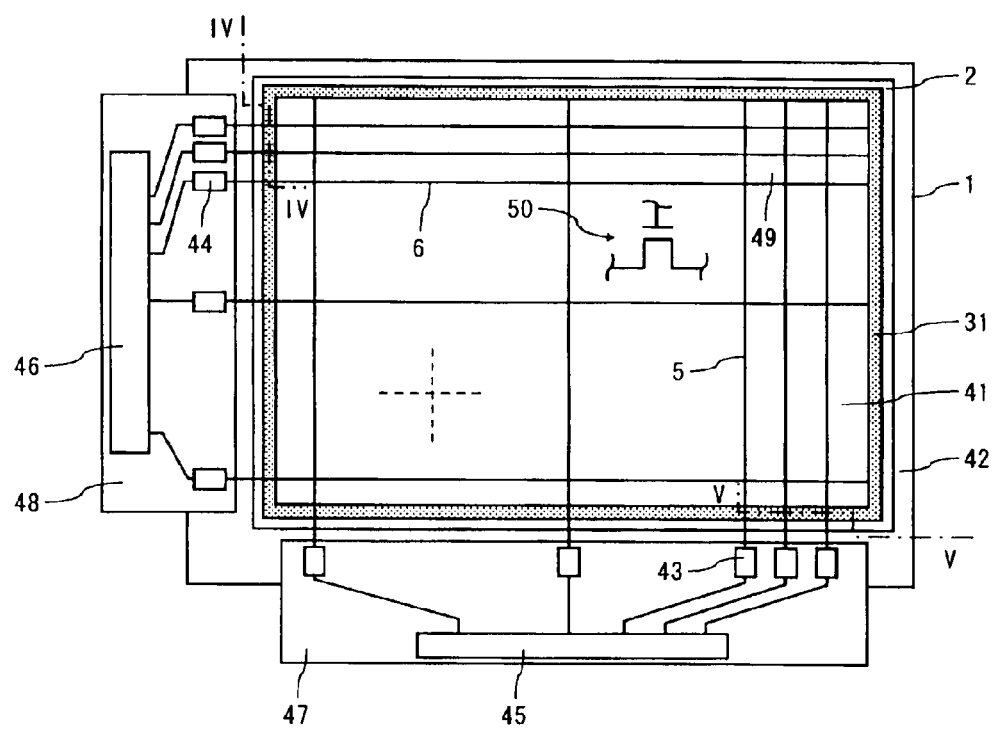
FIG. 1 is a front view showing the structure of a liquid crystal display device according to a present embodiment.

Referring to FIG. 1, a transflective type liquid crystal display device according to the present Embodiment will now be described. FIG. 1 is a front view showing the structure of a liquid crystal display device.

The liquid crystal display device of the present invention includes a liquid crystal display panel 100. In the liquid crystal display panel 100, a thin film transistor array substrate (TFT array substrate) 1 and an opposing substrate 2 are oppositely arranged.

A display area 41 and a frame area 42 surrounding the display area 41 are provided to the TFT array substrate 1. A plurality of gate lines (scanning signal lines) 6 and a plurality of source lines (display signal lines) 5 are formed in the display area 41. The plurality of gate lines 6 are provided in parallel. Likewise, the plurality of source lines 5 are provided in parallel. The gate lines 6 and source lines 5 are formed to cross each other. The gate lines 6 and source lines 5 are orthogonal. Moreover, an area surrounded by adjacent gate lines 6 and source lines 5 is a pixel 49. Accordingly in the TFT array substrate 1, pixels 49 are arranged in matrix.

Furthermore, a flexible substrate 47 on which a control circuit 45 is loaded and a flexible substrate 48 on which a control circuit 46 is loaded are connected to a frame area 42 of the TFT array substrate 1. A gate line 6 extends from a display area 41 to the frame area 42. The gate line 6 is connected to the control circuit 46 through a gate line terminal 44, at the end of the TFT array substrate 1. Similarly, a source line 5 extends from the display area 41 to the frame area 42. The source line 5 is connected to the control circuit 45 through a source line terminal 43, at the end of the TFT array substrate 1.

Various signals from outside are supplied to the control circuits 45 and 46. The control circuit 46 supplies a gate signal (scanning signal) to the gate line 6 according to an external control signal. By the gate signal, the gate lines 6 are selected sequentially. The control circuit 45 supplies a display signal (source signal) to the source lines 5 according to an external control signal or display data. This enables to supply a display voltage according to the display data to each of the pixels 49. The control circuit 45 may be separately loaded on the liquid crystal display panel 100, the flexible substrate 47, and a flexible printed circuit (FPC) (not shown). Similarly, the control circuit 46 may be separately loaded on the liquid crystal display panel 100, the flexible substrate 48, and the FPC. Furthermore, a part of the control circuits 45 and 46 may be formed on the TFT array substrate 1. Inside the pixel 49, at least one TFT 50 is formed. The TFT 50 is placed near the intersection of the source line 5 and the gate line 6. For example, this TFT 50 supplies the display voltage to a pixel electrode. That is, by the gate signal from the gate line 6, the TFT 50, which is a switching device, is turned on. This enables to apply the display voltage to the pixel electrode connected to a drain electrode of the TFT 50 from the source line 5. Moreover, an electric field according to the display voltage is generated between the pixel electrode and an opposing electrode. Note that an alignment layer (not shown) is formed over the surface of the TFT array substrate 1. Detailed structure in a pixel 49 will be described later.

Meanwhile, an opposing substrate 2 is for example a color filter substrate and placed to the visible side. Over the opposing substrate 2, a color filter, black matrix (BM), an opposing electrode, an alignment layer, and so on are formed. Note that the opposing electrode may be placed to the TFT array substrate 1 side. The TFT array substrate 1 and the opposing substrate 2 are bonded each other by a sealing material 31.

The sealing material 31 is formed in the shape of a frame surrounding the display area 41. In addition, a liquid crystal layer is held between the TFT array substrate 1 and the opposing substrate 2. More specifically, liquid crystal is filled between the TF array substrate 1 and the opposing substrate 2. Further, a polarizing plate and retardation film or the like are provided to the outside surface the TFT array substrate 1 and the opposing substrate 2. Moreover, a backlight unit or the like is provided to the non-visible side of the liquid crystal display panel 100.

The liquid crystal is driven by the electric field between the pixel electrode and the opposing electrode. That is, an alignment direction of the liquid crystal between the substrates changes. This changes the polarization state of the light passing through the liquid crystal layer. To be more specific, the light that has passed the polarizing plate and became a linearly polarized light changes its polarization state by the liquid crystal layer. More specifically, in a transparent area, the light from the backlight unit becomes a linearly polarized light by the polarizing plate provided to the TFT array substrate 1 side. Furthermore, by passing through the retardation film of the TFT array substrate 1 side, the liquid crystal layer, and the retardation film of the opposing substrate 2 side, the linearly polarized light changes its polarization state. On the other hand, in a reflection area, an outside light entered from the visible side of the liquid crystal display panel 100 becomes a linearly polarized light by the polarizing plate of the opposing substrate 2. Then, by passing through the retardation film of the opposing substrate 2 and the liquid crystal layer back and forth, this light changes its polarization state.

Thus, the amount of light passing through the polarizing plate of the opposing substrate 2 side varies according to the polarization state. More specifically, among transmitted light transmitting from the backlight unit through the liquid crystal panel 100 and reflected light reflected at the liquid crystal panel 100, the amount of light passing through the polarizing plate of the visible side varies. The alignment direction of the liquid crystal varies according to the applied display voltage. Therefore, by controlling the display voltage, the amount of light passing through the polarizing plate of the visible side can be changed. That is, by varying the display voltage to each pixel, a desired image can be displayed.

Figure 2:
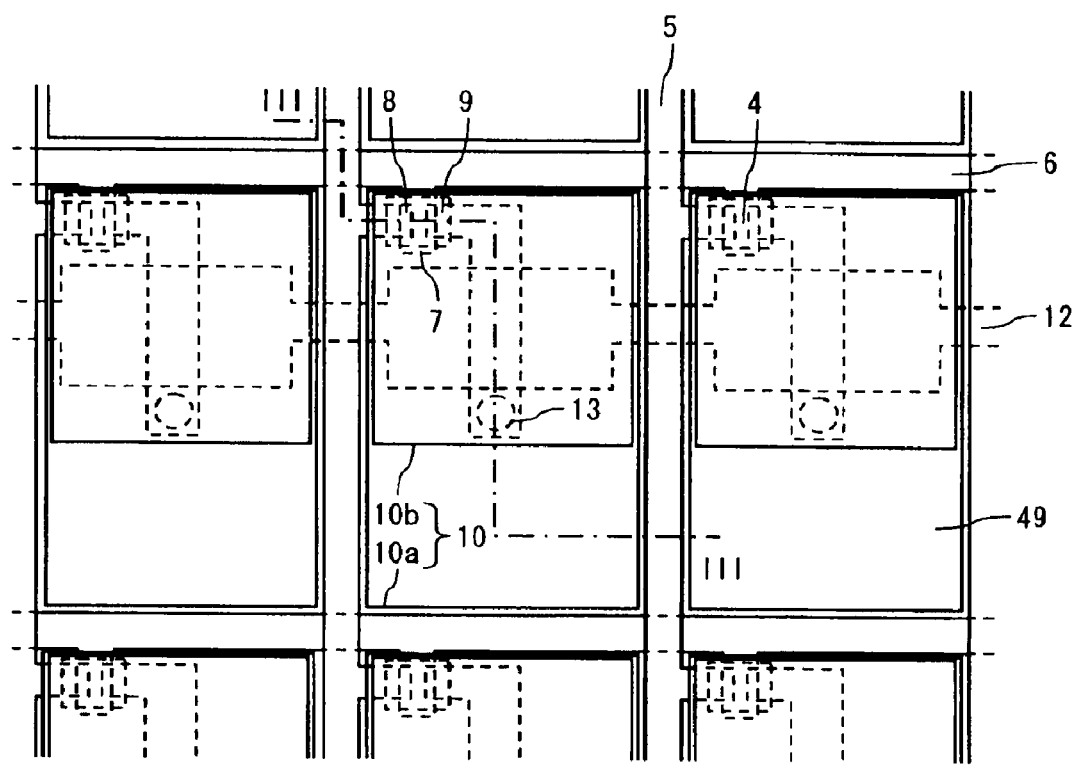
FIG. 2 is a plan view showing the pixel structure of the liquid crystal display panel according to the present embodiment.
Figure 3:
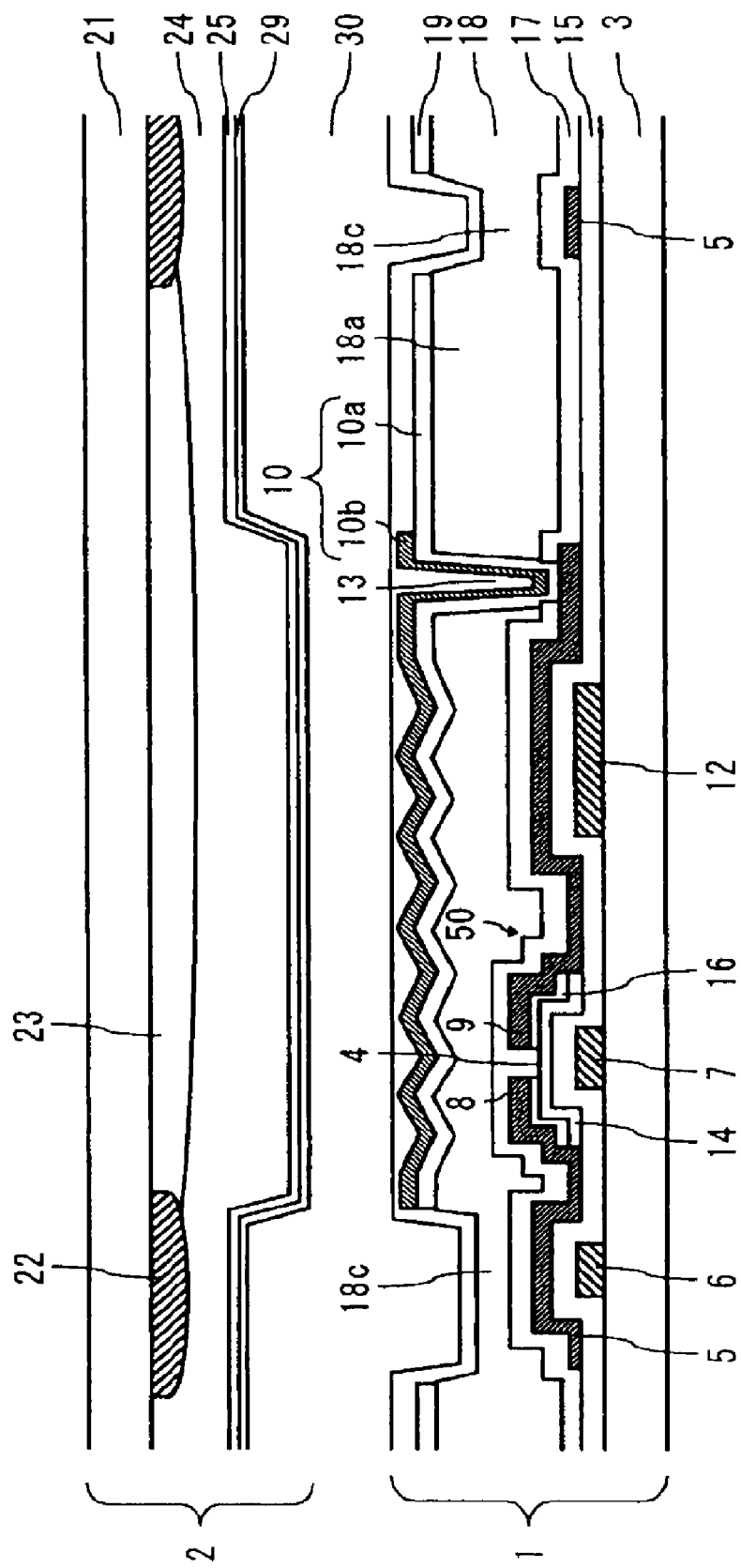
FIG. 3 is a cross-sectional view of FIG. 2.

Next, a pixel structure of the liquid crystal display panel 100 will be described with reference to FIGS. 2 and 3. FIG. 2 is a plan view showing the pixel structure of the liquid crystal display panel 100 according to the present Embodiment. FIG. 3 is a cross-sectional view of FIG. 2. FIG. 2 is a plan view showing one of the pixels 49 of the liquid crystal display panel 100. A plurality of such pixels 49 are arranged in matrix in the liquid crystal display panel 100. In FIG. 2, only the TFT array substrate 1 side of the liquid crystal display panel 100 is illustrated, and the opposing substrate 2 side of it is not shown.

As shown in FIGS. 2 and 3, the TFT array substrate 1 includes a substrate 3 which is transparent and insulated, such as glass or plastic, and on which the gate line 6 and a gate electrode 7 are formed. The gate electrode 7 is arranged branching from the gate line 6 in each pixel 49. Moreover, on the substrate 3, a common line 12 is formed of the same layer as that of the gate line 6. The common line 12 is provided away from the gate line 6 and extends in parallel to the gate line 6. That is, the common line 12 is arranged between the adjacent gate lines 6. The common line 12 is broadly formed in the pixel 49, and serves as a storage capacitor electrode for forming a storage capacitance enabling stable display. In FIG. 3, in the reflective area, the storage capacitance is respectively formed between the common line 12 and a drain electrode 9 mentioned later and between the drain electrode 9 and a pixel electrode 10 mentioned later. The storage capacitor stores a drive voltage from a TFT 50 connected to each pixel 49 even after the TFT 50 has been turned off.

In this case, the gate line 6, the gate electrode 7, and the common line 12 are formed of an Al alloy, for example. It is also possible for them to be formed of a Cu alloy, a Mo alloy, an Ag alloy, or a Cr alloy, and alternatively formed of a laminated multi-layer film composed of such an alloy film and a film, layered beneath the alloy film, which strengthens adhesion to the base, or a laminated multi-layer film composed of such an alloy film and a conductive film, layered over the alloy film, which has good contact characteristics with a transparent conductive film.

There is provided a gate insulating film 15 to cover the gate line 6, the gate electrode 7, and the common line 12. The gate insulating film 15 is formed of silicon nitride (SiN), for example. On the opposite side of the gate electrode 7 with respect to the gate insulating film 15, a semiconductor layer 14 is provided. The semiconductor layer 14 is formed of amorphous silicon, for example.

On the semiconductor layer 14, there are formed the source line 5, a source electrode 8, and the drain electrode 9. The source electrode 8 is arranged branching from the source line 5 in each pixel 49. The drain electrode 9 is provided away from the source electrode 8, on the semiconductor layer 14. That is, the source electrode 8 and the drain electrode 9 are oppositely arranged on the semiconductor layer 14. In addition, an ohmic contact layer 16 is respectively formed between the source electrode 8 and the semiconductor layer 14 and between the drain electrode 9 and the semiconductor layer 14. The ohmic contact layer 16 is provided in the area where the source electrode 8 and the semiconductor layer 14 overlap each other. Similarly, the ohmic contact layer 16 is provided in the area where the drain electrode 9 and the semiconductor layer 14 overlap each other. In the semiconductor layer 14, the area not covered with the source electrode 8 or the drain electrode 9 serves as a channel 4 of the TFT 50.

In this case, the source line 5, the source electrode 8, and the drain electrode 9 are formed of Cr, for example. It is also possible for them to be formed of a low resistance metal, such as a Mo alloy, an Al alloy, and an Ag alloy, and alternatively formed of a laminated multi-layer film composed of such a low resistance metal and a conductive film, layered beneath the low resistance metal, which has good contact characteristics with the ohmic contact layer 16, or a laminated multi-layer film composed of such a low resistance metal and a conductive film, layered over the low resistance metal, which has good contact characteristics with a transparent conductive film.

There is provided a passivation film 17 to cover the source line 5, the source electrode 8, and the drain electrode 9. That is, the passivation film 17 covers the TFT 50. The passivation film 17 is formed of an inorganic insulating film, such as SiN. Furthermore, there is applied an organic film 18 over the passivation film 17. On the drain electrode 9 of the TFT 50, a contact hole 13 is formed in the organic film 18 and the passivation film 17. That is, the contact hole 13 penetrates the organic film 18 and the passivation film 17, and reaches the drain electrode 9 of the TFT 50.

The organic film 18 is an organic resin film serving as a base layer for forming the pixel electrode 10, and planarizes the unevenness on the substrate 3 produced by the source line 5, the gate line 6, the common line 12, the TFT 50, etc. Since the liquid crystal display device according to the present Embodiment is a transflective type liquid crystal display device, the pixel 49 includes a transmissive area and a reflective area. In the reflective area, uneven patterns are formed on the surface of the organic film 18 so that reflected lights may have a suitable dispersed distribution.

On the organic film 18, there is provided the pixel electrode 10 connected to the drain electrode 9 through the contact hole 13. The pixel electrode 10 has a single layer structure of a transmissive electrode 10a in the transmissive area, and a laminated multi-layer structure where a reflective electrode 10b is layered on the transmissive electrode 10a in the reflective area. That is, the transmissive electrode 10a is provided in both the transmissive area and the reflective area. In this case, the transmissive electrode 10a is formed of a transparent conductive film, such as an ITO. The transmissive electrode 10a is not limited to the ITO, and it may be formed of other transparent conductive film, such as an ITSO and an IZO. On the other hand, the reflective electrode 10b is provided only in the reflective area. In this case, the reflective electrode 10b is formed of a reflective conductive film, such as an AL alloy. It is also possible for the reflective electrode 10b to be formed of a high reflective metal, such as an Ag alloy, or formed of a reflective conductive film such as a laminated multi-layer film composed of the high reflective metal and a contact metal layered beneath the high reflective metal. Alternatively, it may have a structure where a transparent conductive film is coated on the reflective electrode 10b in order to prevent burn-in.

In the present Embodiment, as shown in FIG. 3, the film thickness of the organic film 18 at the area covered with the pixel electrode 10 is thicker than that at the area not covered with the pixel electrode 10. That is, in the organic film 18, a thick film portion 18a is formed in the area covered with the pixel electrode 10 and a thin film portion 18c is formed in the area not covered with the pixel electrode 10. The reason for this state will be mentioned later. There is provided an alignment film 19 for aligning a liquid crystal 30, on the pixel electrode 10.

Figure 4:
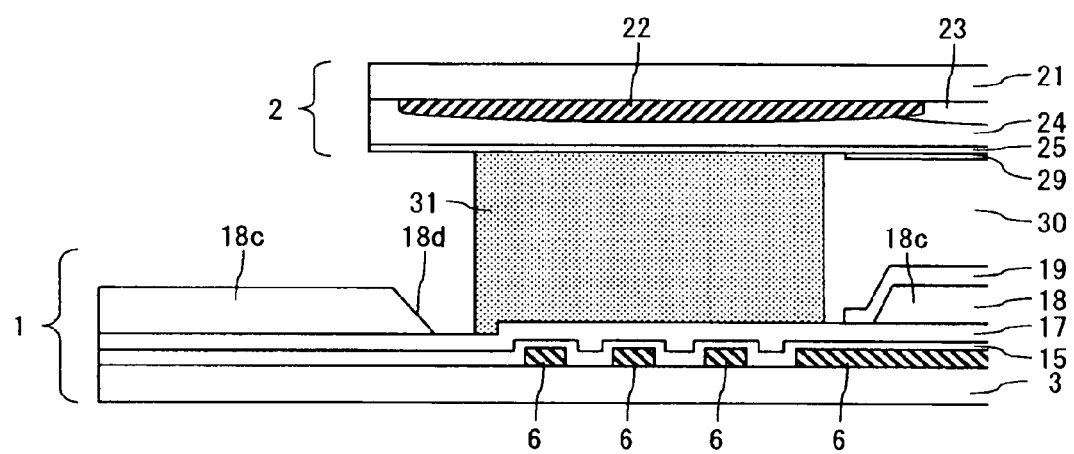
FIG. 4 is a cross-sectional view cut through the line IV-IV in FIG. 1.
Figure 5:
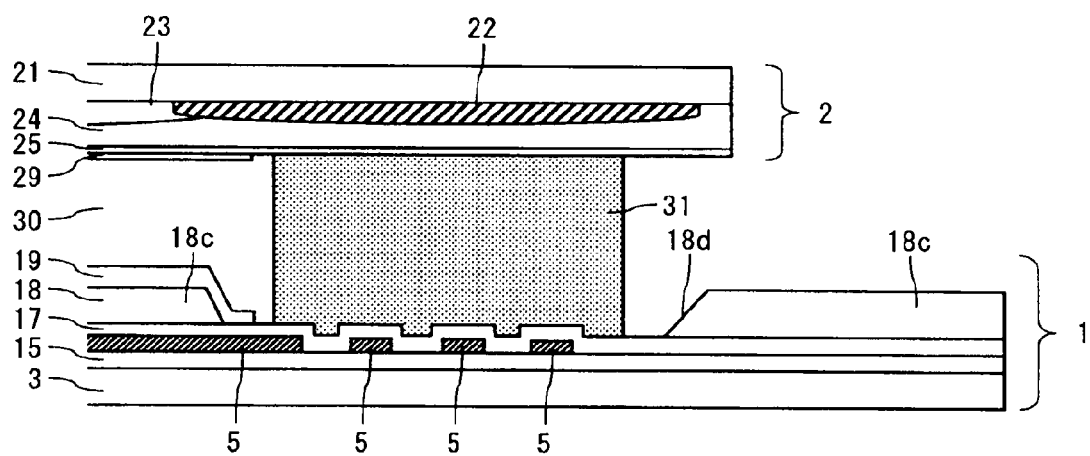
FIG. 5 is a cross-sectional view cut through the line V-V in FIG. 1.

In the opposing substrate 2, there is formed a black matrix 22 on the surface of a substrate 21 to be opposite to the TFT array substrate 1. The black matrix 22 is made of a metal such as a pigment or chromium and is for shielding lights. The black matrix 22 is provided to be opposite side to the source line 5 and the gate line 6 and is in a grid-like configuration. Then, a color material 23 composed of a pigment or dye is formed to fill between the black matrices 22. The color material 23 is a color filter of R (red), G (green), and B (blue). Further, there is formed an overcoat 24 to cover the black matrix 22 and the color material 23. The overcoat 24 is formed to be thicker in the reflective area than in the transmissive area. Thereby, the space (gap) between the TFT array substrate 1 and the opposing substrate 2 in the transmissive area can be broader than that in the reflective area. There are layered an opposing electrode 25 and an alignment film 29 on the overcoat 24 in this order. The opposing electrode 25 produces an electric field between itself and the pixel electrodes 10 of the TFT array substrate 1, so as to drive the liquid crystal 30. Now, referring to FIGS. 4 and 5, the structure of the sealing portion will be described. FIGS. 4 and 5 are cross-sectional views showing the structure of the periphery of the sealing portion of the liquid crystal display panel 100 according to the present Embodiment. FIG. 4 is a cross-sectional view cut through the line IV-IV in FIG. 1, and shows the periphery of the scaling portion at the side of the gate line terminal 44. FIG. 5 is a cross-sectional view cut through the line V-V in FIG. 1, and shows the periphery of the sealing portion at the side of the source line terminal 43.

In FIG. 4, there is formed the gate line 6 on the substrate 3 of the TFT array substrate 1. The gate insulating film 15 and the passivation film 17 are coated in this order to cover the gate line 6. In FIG. 5, the source line 5 is formed on the gate insulating film 15 provided over the substrate 3. The passivation film 17 is formed to cover the source line 5.

In FIGS. 4 and 5, the organic film 18 is formed on the passivation film 17. According to the present Embodiment, the organic film 18 under and around the sealing material 31 is removed to provide an opening 18d. The opening 18d is formed to be broader than the sealing material 31. Therefore, the opening 18d, which is broader than the sealing material 31, is provided to be in the shape of a frame surrounding the display area 41. According to the present Embodiment, since the passivation film 17 provided under the opening 18d is not affected by a film thickness loss caused by etching etc., its film thickness is approximately the same as that of the passivation film 17 provided under the thin film portion 18c or the thick film portion 18a.

FIGS. 4 and 5 show cross-sectional structure of the area where the pixel electrode 10 is not provided on the organic film 18 at the display area 41 side from the sealing material 31. In this case, the thin film portion 18c is arranged at the display area 41 side from the sealing material 31 as well as the structure of the pixel 49 shown in FIG. 3. Moreover, the thin film portion 18c is also arranged at the frame area 42 side from the sealing material 31.

The TFT array substrate 1 described above adheres to the opposing substrate 2 through the sealing material 31. At the side of the opposing substrate 2, the sealing material 31 is arranged in the pattern of the black matrix 22 and adheres to the opposing electrode 25. On the other hand, at the side of the TFT array substrate 1, the sealing material 31 is arranged in the opening 18d provided in the organic film 18. That is, the sealing material 31 adheres to the passivation film 17 in the opening 18d. Thereafter, the liquid crystal 30 is filled in the space surrounded by the TFT array substrate 1, the opposing substrate 2, and the sealing material 31. In addition, the alignment film 19 is provided on the surface of the TFT array substrate 1 contacting the liquid crystal 30, and the alignment film 29 is provided on the surface of the opposing substrate 2 contacting the liquid crystal 30. That is, the alignment films 19 and 29 are arranged at the inner side from the sealing material 31.

Now, a manufacturing method of the transflective type liquid crystal display device according to the present Embodiment will be described with reference to FIGS. 6A to 6C through 13A to 13C. FIGS. 6A to 6C through 13A to 13C are cross-sectional views showing one manufacturing process of the TFT array substrate according to the present Embodiment. FIGS. 6A, 7A, 8A, 9A, 10A, 11A, 12A, and 13A are cross-sectional views showing the inside of the pixel 49, corresponding to the section in FIG. 2. FIGS. 6B, 7B, 8B, 9B, 10B, 11B, 12B, and 13B are cross-sectional views showing the periphery of the sealing portion at the side of the gate line terminal 44, corresponding to the IV-IV section in FIG. 1. FIGS. 6C, 7C, 8C, 9C, 10C, 11C, 12C, and 13C are cross-sectional views showing the periphery of the sealing portion at the side of the source line terminal 43, corresponding to the V-V section in FIG. 1.

Figure 6A:
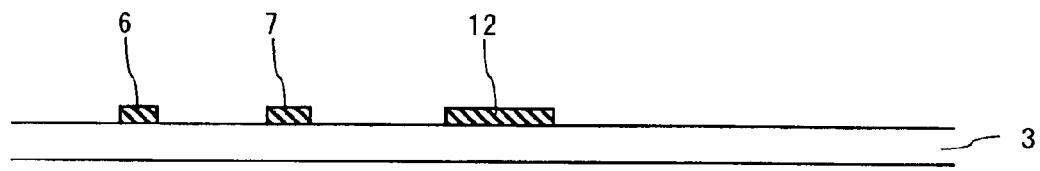
FIGS. 6A to 6C are cross-sectional views showing one manufacturing process of the TFT array substrate according to the present embodiment.
Figure 6B:
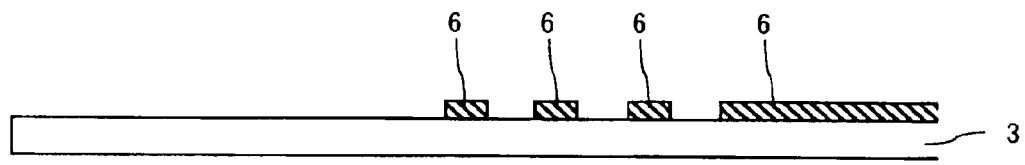
Figure 6C:
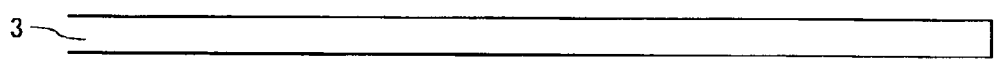

First, with reference to FIGS. 6A to 6C, a manufacturing process related to a first photolithography step will be described. To begin with, an electrode film serving as the gate line 6, the gate electrode 7, and the common line 12 is formed on the substrate 3. For example, by the spatter method, etc., an electrode film of an Al alloy, etc. is formed all over the substrate 3. The electrode film is not limited to be formed of the Al alloy, and it may be formed of a Cu alloy, a Mo alloy, an Ag alloy, or a Cr alloy, and alternatively formed of a laminated multi-layer film composed of such an alloy film and a film, layered beneath the alloy film, which strengthens adhesion to the base, or a laminated multi-layer film composed of such an alloy film and a conductive film, layered over the alloy film, which has good contact characteristics with a transparent conductive film. Next, a resist pattern is formed on the electrode film by the process of the first photolithography step. The electrode film is patterned by the wet etching method, etc. Then, removing the resist pattern, the gate line 6, the gate electrode 7, and the common line 12 are formed as shown in FIGS. 6A to 6C.

Figure 7A:
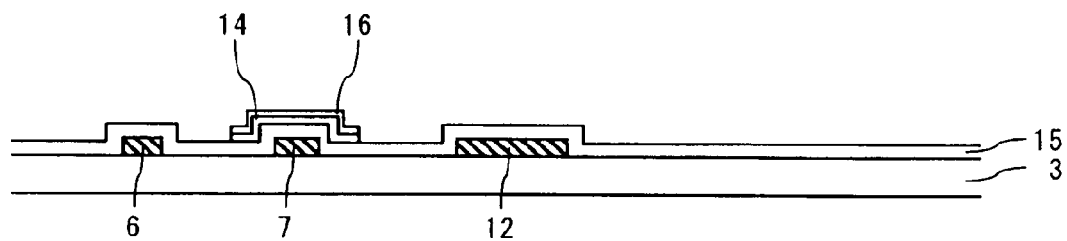
FIGS. 7A to 7C are cross-sectional views showing one manufacturing process of the TFT array substrate according to the present embodiment.
Figure 7B:
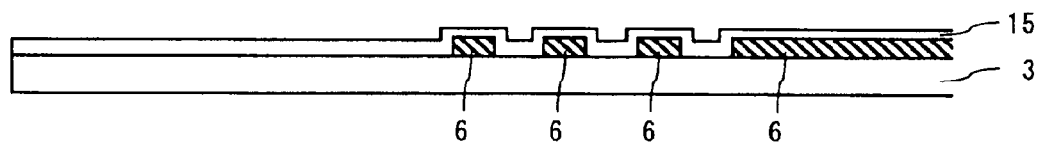
Figure 7C:
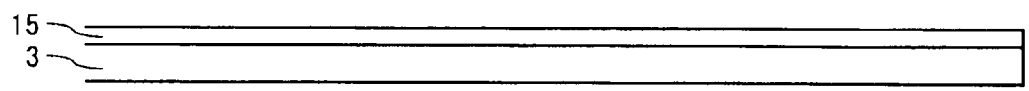

Next, with reference to FIGS. 7A to 7C, a manufacturing process related to from a step of forming the gate insulating film 15 through a second photolithography step will be described. The gate insulating film 15 is formed to cover the gate line 6, the gate electrode 7, and the common line 12. For example, by the plasma CVD method, SiN is formed as the gate insulating film 15 all over the substrate 3. Then, the semiconductor layer 14 and the ohmic contact layer 16 are formed on the gate insulating film 15 in this order. For example, by the plasma CVD method, after forming an amorphous silicon film as the semiconductor layer 14 all over the substrate 3, an n-type amorphous silicon film to which impurities such as phosphorus (P) is added is formed as the ohmic contact layer 16 all over the substrate 3.

Then, a resist pattern is formed on the ohmic contact layer 16 by the process of the second photolithography step. The ohmic contact layer 16 and the semiconductor layer 14 are patterned in the shape of an island by dry etching etc. Removing the resist pattern, the semiconductor layer 14 and the ohmic contact layer 16 are formed on the opposite side of the gate electrode 7 with respect to the gate insulating film 15 as shown in FIG. 7A. At this time, on the periphery of the sealing portion at the side of the gate line terminal 44, the gate line 6 is covered with the gate insulating film as shown in FIG. 7B. On the periphery of the sealing portion at the side of the source line terminal 43, the gate insulating film 15 is coated over the substrate 3 as shown in FIG. 7C.

Figure 8A:
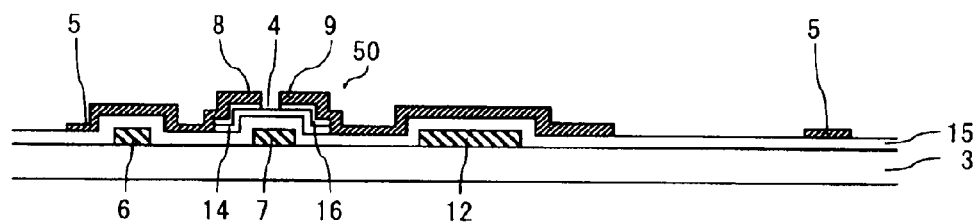
FIGS. 8A to 8C are cross-sectional views showing one manufacturing process of the TFT array substrate according to the present embodiment.
Figure 8B:
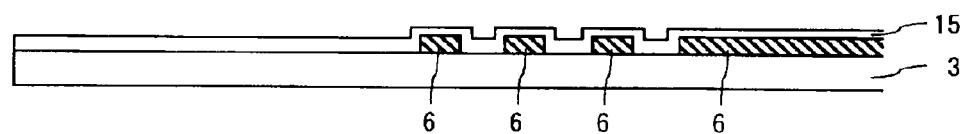
Figure 8C:
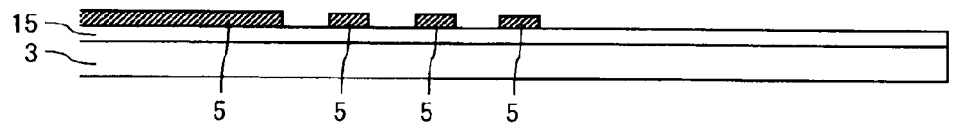

Now, with reference to FIGS. 8A to 8C, a manufacturing process related to a third photolithography step will be described. An electrode film serving as the source line 5, the source electrode 8 and the drain electrode 9 is formed to cover the semiconductor layer 14 and the ohmic contact layer 16. For example, by the spatter method etc., an electrode film of Cr, etc. is formed all over the substrate 3. The electron film is not limited to be formed of the Cr, and it may be formed of a low resistance metal, such as a Mo alloy, an Al alloy, an Ag alloy, etc., and alternatively formed of a laminated multi-layer film composed of such a low resistance metal and a conductive film, layered beneath the low resistance metal, which has good contact characteristics with the ohmic contact layer 16, or a laminated multi-layer film composed of such a low resistance metal and a conductive film, layered over the low resistance metal, which has good contact characteristics with a transparent conductive film. Next, a resist pattern is formed on the electrode film by the process of the third photolithography step. Then, an electrode film is patterned by the wet etching method etc. Thereby, the source line 5, the source electrode 8, and the drain electrode 9 are formed. Thereafter, the ohmic contact layer 16, which is exposed to the surface, without being covered with the source electrode 8 or the drain electrode 9, is removed by dry etching etc. Thereby, the semiconductor layer 14 between the source electrode 8 and the drain electrode 9 is exposed to form the channel 4. Then, removing the resist pattern, the structure as shown in FIGS. 8A to 8C can be obtained.

Figure 9A:
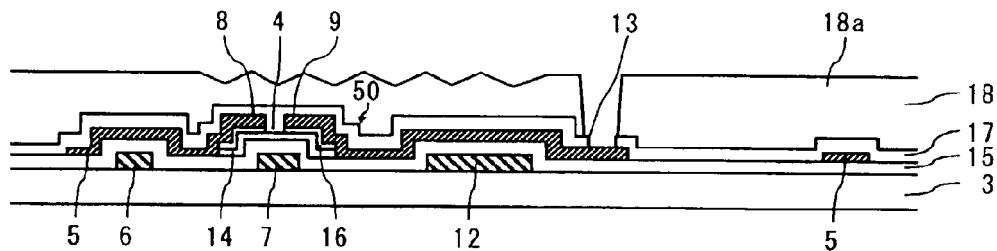
FIGS. 9A to 9C are cross-sectional views showing one manufacturing process of the TFT array substrate according to the present embodiment.
Figure 9B:
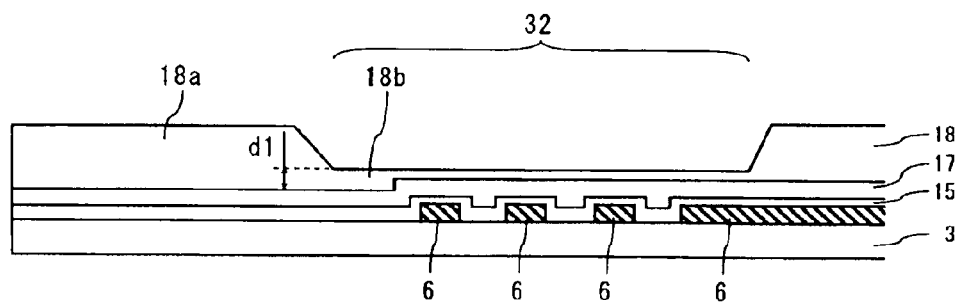
Figure 9C:
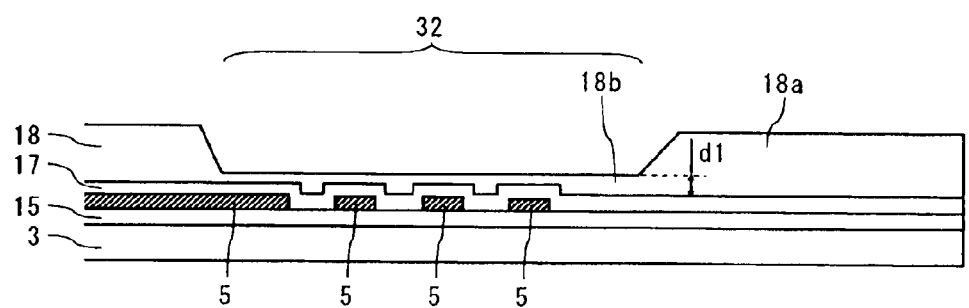

Next, with reference to FIGS. 9A to 9C, a manufacturing process related to from a step of forming the passivation film 17 through a fourth photolithography step will be described. The passivation film 17 is formed to cover the source line 5, the source electrode 8, and the drain electrode 9. For example, by the plasma CVD method, SiN is formed as the passivation film 17 all over the substrate 3. The organic film 18 having photosensitivity is applied on the passivation film 17. Then, the fourth photolithography step is performed to pattern the organic film 18. At this time, according to the present Embodiment, the organic film 18 including the thick film portion 18a, a thin film portion 18b and the contact hole 13 is formed by using multi level exposure, such as half tone and gray tone.

Specifically, in the area used as the contact hole 13, the organic film 18 is removed to expose the passivation film 17. In the area directly under or around the sealing material 31 (sealing portion periphery area 32), the thin film portion 18b whose film thickness is thin is formed by using the multi level exposure as shown in FIGS. 9B and 9C. At this time, conditions of the fourth photolithography step are adjusted so that a film thickness d1 of the thin film portion 18b may be thinner than a film thickness d2 which is removed by plasma ashing mentioned later. In the area except for the contact hole 13 and the thin film portion 18b, the thick film portion 18a whose film thickness is thicker than that of the thin film portion 18b is formed. On the reflective area in the thick film portion 18a, uneven patterns are formed on the surface by partially exposing. In the fourth photolithography step, as mentioned above, the organic film 18 which has different film thicknesses is formed by using a first multi-level exposure.

Then, using this organic film 18 as a mask, the passivation film 17 is patterned by the dry etching method etc. Thereby, the passivation film 17 in the area used as the contact hole 13 is removed to expose the drain electrode 9 as shown in FIG. 9A.

Figure 10A:
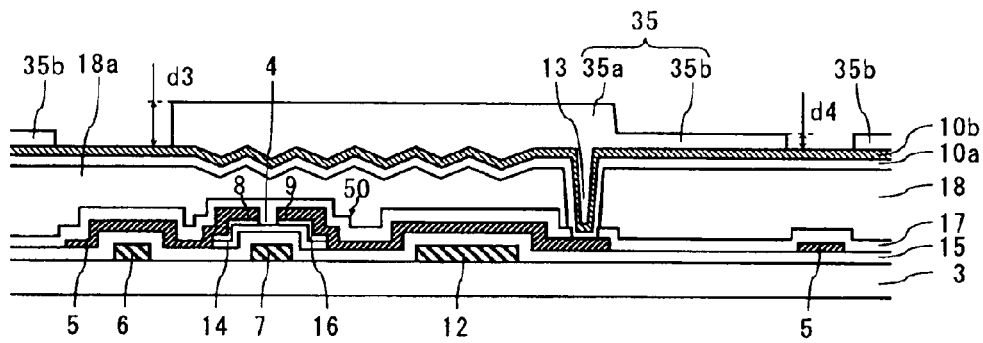
FIGS. 10A to 10C are cross-sectional views showing one manufacturing process of the TFT array substrate according to the present embodiment.
Figure 10B:
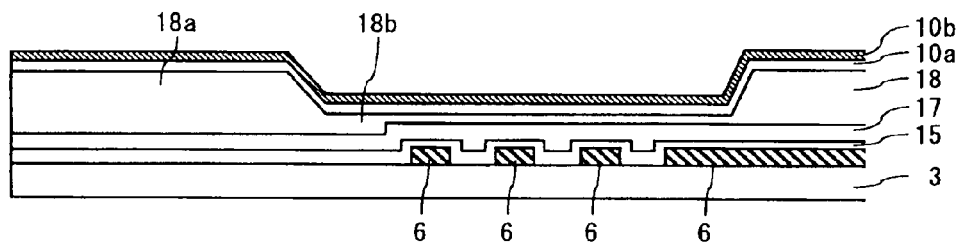
Figure 10C:
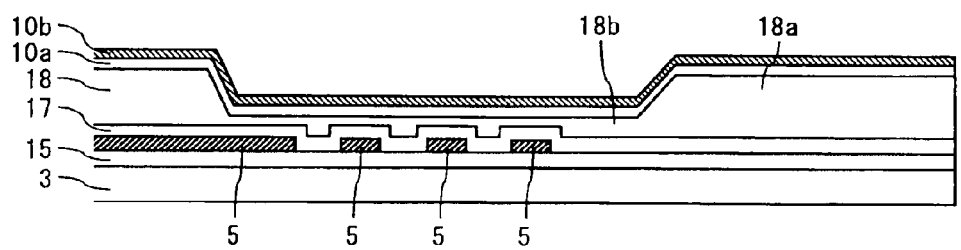

Next, with reference to FIGS. 10A to 10C, a manufacturing process related to from a step of forming a film of the transmissive electrode 10a and the reflective electrode 10b through a fifth photolithography step will be described. A transparent conductive film serving as the transmissive electrode 10a is formed on the organic film 18, and further, a reflective conductive film serving as the reflective electrode 10b is formed thereon. For example, by the spatter method, an amorphous ITO as the transparent conductive film, and an Al alloy film as the reflective conductive film are formed all over the substrate 3 in this order. ITSO, IZO, etc. may be used for the transparent conductive film serving as the transmissive electrode 10a. Moreover, it is also possible to use a high reflective metal, such as an Ag alloy, or a laminated multi-layer film composed of such an alloy film and a contact metal film layered beneath the alloy film, for the reflective conductive film serving as the reflective electrode 10b. Thereby, the contact hole 13 is covered with the transmissive electrode 10a and the reflective electrode 10b.

Then, after applying resist (photosensitive resin) over the reflective conductive film by the spin coat method etc., a resist pattern 35 which has different film thicknesses is formed by the process of the fifth photolithography step. The resist pattern 35 includes a thick film portion 35a having a film thickness d3 in the reflective area and a thin film portion 35b having a film thickness d4 in the transmissive area. That is, using the multi-level exposure, the resist pattern 35 is formed so that the film thickness d4 of the transmissive area may be thinner than the film thickness d3 of the reflective area. In the fifth photolithography step, as mentioned above, the resist pattern 35 which has different film thicknesses is formed by using a second multi-level exposure. Thereby, the structure shown in FIGS. 10A, 10B, and 10C can be obtained, where the resist pattern 35 is not formed in the sealing portion periphery area 32 as shown in FIGS. 10B and 10C.

Figure 11A:
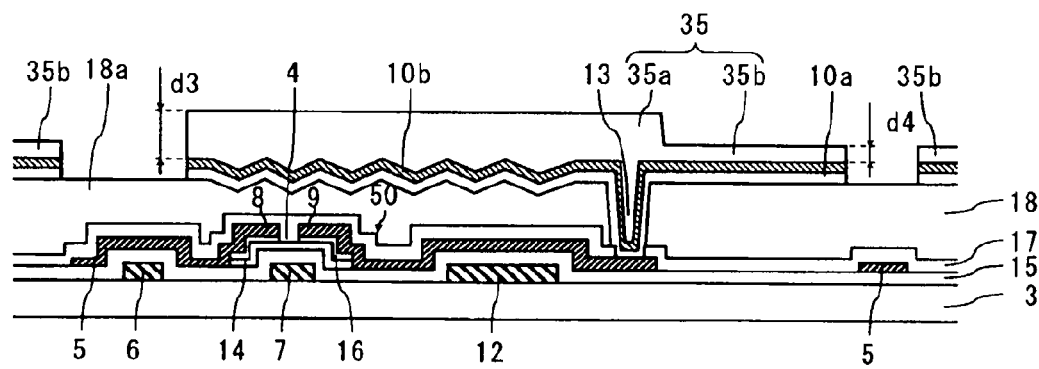
FIGS. 11A to 11C are cross-sectional views showing one manufacturing process of the TFT array substrate according to the present embodiment.
Figure 11B:
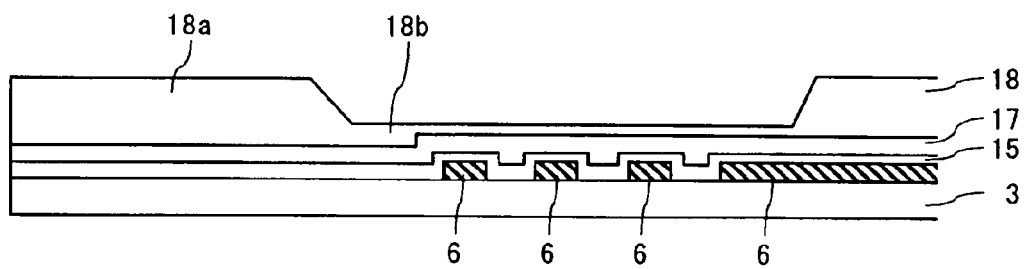
Figure 11C:
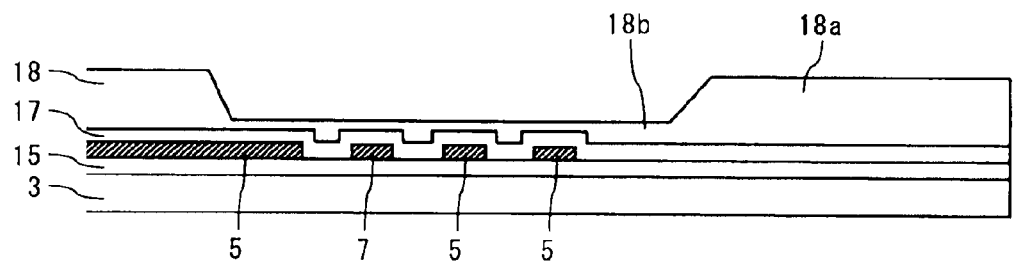

Now, with reference to FIGS. 11A to 11C, a manufacturing process related to a step of etching the transmissive electrode 10a and the reflective electrode 10b will be described. Using the resist pattern 35 as a mask, patterning is performed for the reflective electrode 10b and the transmissive electrode 10a in this order by the well-known wet etching method etc. Thereby, as shown in FIGS. 11A to 11C, the transmissive electrode 10a and the reflective electrode 10b which do not overlap with the resist pattern 35 are removed.

Figure 12A:
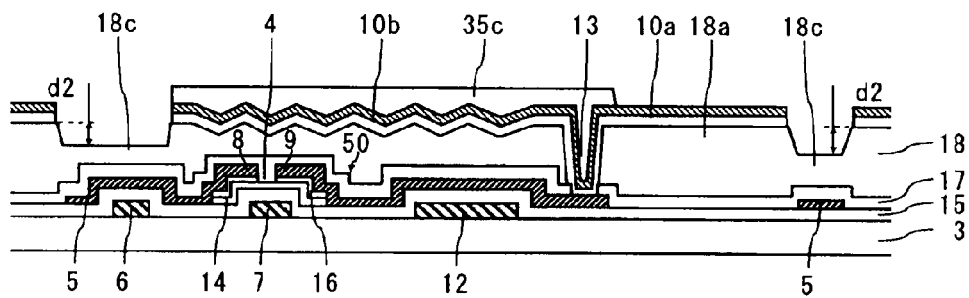
FIGS. 12A to 12C are cross-sectional views showing one manufacturing process of the TFT array substrate according to the present embodiment.
Figure 12B:
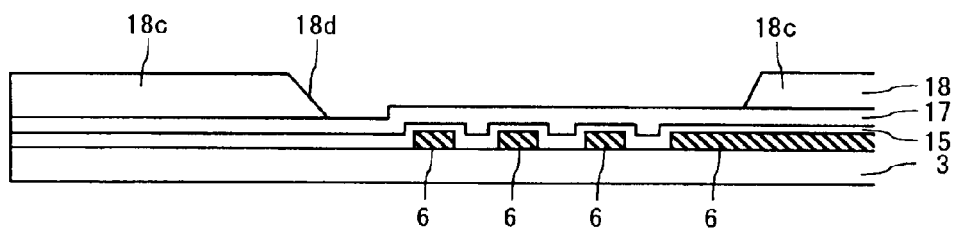
Figure 12C:
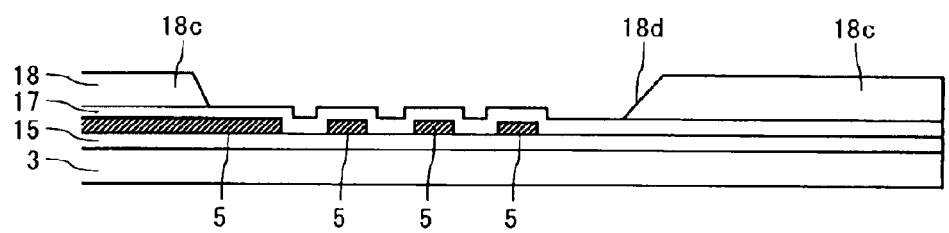

Next, with reference to FIGS. 12A to 12C, a manufacturing process related to an ashing step will be described. After etching the transmissive electrode 10a and the reflective electrode 10b, the thin film portion 35b of the resist pattern 35 is removed by ashing, such as a plasma ashing method. Then, the film thickness of the thick film portion 35a of the resist pattern 35 becomes thin and the pattern remains as a resist pattern 35c. That is, as shown in FIG. 12A, the resist pattern 35 from which the thin film portion 35b has been removed serves as the resist pattern 35c. Simultaneously, according to the present Embodiment, the thin film portion 18b of the organic film 18, exposed from the transmissive electrode 10a, is removed to form the opening 18d as shown in FIGS. 12B and 12C. That is, ashing is performed for the organic film 18 in the area exposed from the transmissive electrode 10a, by utilizing ashing of the resist pattern 35. Then, the film thickness d2 of the thick film portion 18a of the organic film 18, exposed from the transmissive electrode 10a, becomes thin and the portion remains as a thin film portion 18c.

As mentioned above, the thin film portion 35b of the resist pattern 35 is removed by ashing, and the thin film portion 18b of the organic film 18, exposed from the transmissive electrode 10a, is removed by ashing to form the opening 18d according to the present Embodiment. That is, by this ashing, the thin film portion 18b is removed and the opening 18d is formed in the sealing portion periphery area 32. Since the opening 18d is formed in the sealing portion periphery area 32 by such a method, the passivation film 17 in the opening 18d is not damaged by etching etc. Therefore, the passivation film 17 in the opening 18d does not have a film thickness loss caused by the damage, and has the same film thickness as that of the passivation film 17 in the area covered with the organic film 18. As shown in FIG. 12B, under the opening 18d, the lead line of the gate line 6 is covered with this passivation film 17 and the gate insulating film 15. Moreover, as shown in FIG. 12C, under the opening 18d, the lead line of the source line 5 is covered with the passivation film 17.

Figure 13A:
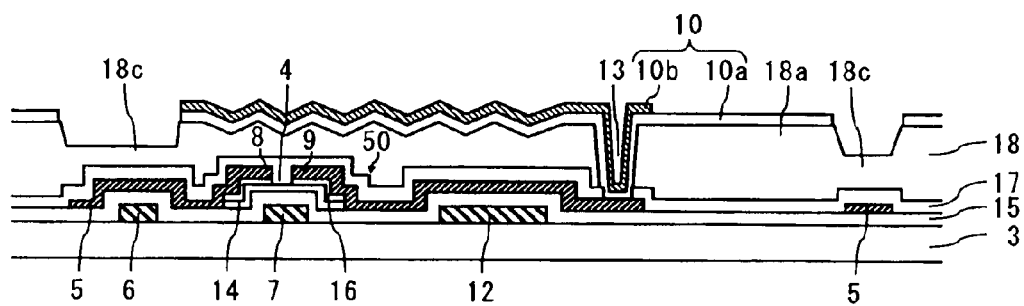
FIGS. 13A to 13C are cross-sectional views showing one manufacturing process of the TFT array substrate according to the present embodiment.
Figure 13B:
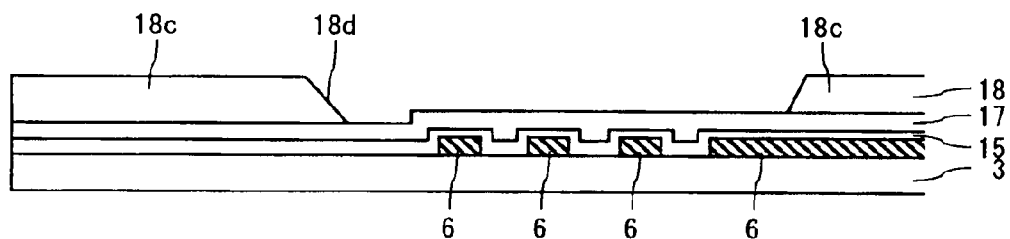
Figure 13C:
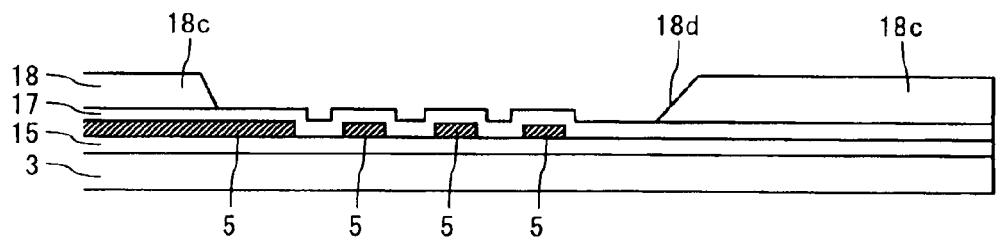

Now, with reference to FIGS. 13A to 13C, a manufacturing process related to from a step of etching the reflective electrode 10b through a step of removing the resist pattern 35 will be described. After ashing, patterning is performed for the reflective electrode 10b with using the resist pattern 35c as a mask, by the well-known wet etching method etc. Thereby, the reflective electrode 10b in the transmissive area is removed. That is, as shown in FIG. 13A, the transmissive electrode 10a in the transmissive area is exposed to form the pixel electrode 10. Since a method suitable for the material of the reflective electrode 10b is used for the etching at this time, the passivation film 17 exposed in the opening 18d is not damaged by the etching. Then, the resist pattern 35c is removed and an annealing treatment is performed to crystallize an amorphous ITO of the reflective electrode 10b. Consequently, the structure shown in FIGS. 13A to 13C can be obtained. Through the steps described above, the TFT array substrate 1 according to the present Embodiment is completed.

The alignment film 19 is formed over the TFT array substrate 1 produced in the way described above. Moreover, the alignment film 29 is similarly formed over the opposing substrate 2 which has been produced separately. Thereafter, an orientation treatment (rubbing treatment) is performed for the alignment films 19 and 29 to produce a micro roughness in one direction on the contacting surface with liquid crystal. Next, the sealing material 31 is applied to bond the TFT array substrate 1 and the opposing substrate 2. Concretely, at the side of the TFT array substrate 1, the TFT array substrate 1 and the opposing substrate 2 are bonded in such a manner that the sealing material 31 is arranged in the opening 18d of the organic film 18. That is, the sealing material 31 is bonded to the passivation film 17 in the opening 18d.

Since the organic film 18 extending from the display area 41 does not extend to the outside of the sealing material 31, it is possible to prevent moisture from permeating through the organic film 18. At this time, under the sealing material 31, the lead line of the gate line 6 is covered with the gate insulating film 15 and the passivation film 17 which has not been damaged. The lead line of the source line 5 is covered with the passivation film 17 which has not been damaged. Accordingly, it is possible to suppress an insulation decrease between the lead lines of the gate line 6 or the source line 5. Moreover, it is possible to deter the lead line being broken by corrosion caused by directly contacting the sealing material 31. Thus, the reliability of the liquid crystal display device can be enhanced.

After bonding the TFT array substrate 1 and the opposing substrate 2, the liquid crystal 30 is injected from the liquid crystal inlet by the vacuum injection method, etc. Then, the inlet of the liquid crystal is sealed. Thus, the liquid crystal display panel 100 according to the present Embodiment is completed.

In the present Embodiment, as mentioned above, after applying the organic film 18 over the passivation film 17, the contact hole 13 is formed on the organic film 18 on the drain electrode 9 and the thin film portion 18b is formed in the sealing portion periphery area 32, by using the first multi-level exposure. Then, the passivation film 17 is etched by using the organic film 18 as a mask, to form the contact hole 13 which reaches the drain electrode 9. After forming the transmissive electrode 10a and the reflective electrode 10b as films over the organic film 18 in this order, the resist pattern 35 having different film thicknesses is formed using the second multi-level exposure, and then, the transmissive electrode 10a and the reflective electrode 10b are etched. Thereafter, ashing is performed to remove the thin film portion 35b of the resist pattern 35, and the thin film portion 18b of the organic film 18, exposed from the transmissive electrode 10a, thereby forming the opening 18d. Thus, the opening 18d can be formed in the organic film 18 of the sealing portion periphery area 32 without increasing the number of photolithography steps. Therefore, moisture permeation through the organic film 18 can be prevented. In the sealing portion periphery area 32, only the organic film 18 is removed by ashing and the passivation film 17 remains without being damaged. Accordingly, it is possible to suppress an insulation decrease between the lead lines of the gate line 6 or the source line 5, and to prevent the lead line from being broken. Therefore, the transflective type liquid crystal display device capable of improving the reliability without increasing the number of photolithography steps, and a manufacturing method thereof can be provided.

In the Embodiment described above, while the case of the organic film 18 under the sealing material 31 being removed by the width larger than the width of the sealing material 31 in order to remain the organic film 18 outside the sealing material 31 is explained as an exemplification, it is not limited to such a case. The organic film 18 outside (frame area 42 side) of the sealing material 31 may be removed. In this case, if the thin film portion 18b of the organic film 18 in the area to be removed is formed similarly to the sealing portion periphery area 32 by the first multi-level exposure, it is possible to perform removing by ashing after the second multi-level exposure. Furthermore, while the sealing material 31 is arranged inside the opening 18d, it is also possible for the sealing material 31 to be arranged to straddle the organic film 18 outside the opening 18d. That is, if the end of the organic film 18 extending from the display area 41 is located inside the outer end of the sealing material 31, moisture permeation through the organic film 18 can be prevented.

Moreover, although a step (unevenness) is provided in the overcoat 24 of the opposing substrate 2 in order to make the gaps in the transmissive area and the reflective area be different, it is also preferable to provide the step not on the side of the opposing substrate 2 but on the side of the TFT array substrate 1. For example, the film thickness of the organic film 18 in the transmissive area may be different from that in the reflective area. In this case, a thin film portion is formed in the transmissive area by the first multi-level exposure when forming the organic film 18. The film thickness of the thin film portion formed in the transmissive area may be the same as that of the thin film portion 18b of the sealing portion periphery area 32, and alternatively they may be different from each other. That is, film thickness of the thin film portion formed in the transmissive area can be appropriately set up depending upon a required step (unevenness). Since this thin film portion is covered with the transmissive electrode 10a, it remains as a thin film portion without being removed by ashing. In addition, although the thick film portion 18a is formed by the first multi-level exposure in the area except for the transmissive area, the reflective area, the contact hole 13, and the sealing portion periphery area 32, it is also possible to form the thin film portion 18b similarly to the sealing portion periphery area 32. Since this thin film portion 18b is not covered with the transmissive electrode 10a, it can be removed by ashing to form the opening 18d.

Furthermore, although patterning of the source line 5, the source electrode 8, and the drain electrode 9 is performed in the photolithography step which is different from the photolithography step for patterning of the semiconductor layer 14, it is also preferable to perform the patterning for them in the same photolithography step by using the multi-level exposure. In that case, the structure is in such a manner that the ohmic contact layer 16 and the semiconductor layer 14 are formed approximately all over the area under the source line 5, the source electrode 8, and the drain electrode 9. Then, the multi-level exposure is performed for the forming area of the channel 4.

In addition, while the case of forming a TFT of channel etching type has been explained above as an exemplification, an etching stopper type TFT, or a top gate type TFT using polysilicon for the semiconductor layer 14 may also be used.

The above explanation is to describe the embodiments of the present invention and the present invention is not limited to the above embodiments. Moreover, those skilled in the art can change, add and change each component of the above embodiments easily in the scope of the present invention.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A transflective type liquid crystal display device comprising:
   a first substrate including a thin film transistor formed thereover;
   a second substrate arranged oppositely to the first substrate;
   a sealing material, formed in a shape of a frame surrounding a display area, to bond the first substrate and the second substrate;
   an inorganic insulating film to cover the thin film transistor over the first substrate;
   an organic film formed on the inorganic insulating film; and
   a pixel electrode including a transmissive electrode provided on the organic film and a reflective electrode provided on a part of the transmissive electrode, and the pixel electrode connecting to the thin film transistor through a contact hole penetrating the organic film and the inorganic insulating film, wherein
   the organic film includes a thick film portion provided under the reflective electrode, a concave portion formed outside of the transmissive electrode and having a surface of a thin film portion as a bottom surface, the thin film portion has a film thickness thinner than a film thickness of the thick film portion, and an opening, and
   the sealing material is arranged in the opening.

2. The transflective type liquid crystal display device according to claim 1 further comprising:
   a gate line formed of a same layer as a layer of a gate electrode of the thin film transistor; and
   a source line formed of a same layer as a layer of a source electrode of the thin film transistor, wherein
   the gate line and the source line are covered with at least the inorganic insulating film, under the sealing material.

3. The transflective type liquid crystal display device according to claim 1, wherein the opening is formed to surround a display area.

* * * * *